(12) United States Patent
Vijay (10) Patent No.: US 9,899,048 B1
(45) Date of Patent: Feb. 20, 2018

(54) HEAD STACK FLEX ASSEMBLY AND BASE ASSEMBLY FOR STORAGE DRIVE AND METHOD OF ASSEMBLY

(71) Applicant: Western Digital Technologies, Inc., Irvine, CA (US)

(72) Inventor: Mukund Vijay, Sunnyvale, CA (US)

(73) Assignee: WESTERN DIGITAL TECHNOLOGIES, INC., Irvine, CA (US)

( * ) Notice: Subject to any disclaimer, the term of this patent is extended or adjusted under 35 U.S.C. 154(b) by 0 days.

(21) Appl. No.: 15/137,863

(22) Filed: Apr. 25, 2016

(51) Int. Cl.
*G11B 5/48* (2006.01)
*H05K 1/02* (2006.01)
*H05K 1/18* (2006.01)

(52) U.S. Cl.
CPC ........... *G11B 5/486* (2013.01); *G11B 5/4846* (2013.01); *H05K 1/0281* (2013.01); *H05K 1/189* (2013.01); *H05K 2201/056* (2013.01)

(58) Field of Classification Search
CPC .... G11B 5/4846; G11B 5/4806; H05K 1/189; H05K 1/028; H05K 1/0281; H05K 2201/056
See application file for complete search history.

(56) References Cited

U.S. PATENT DOCUMENTS

| | | | |
|---|---|---|---|
| 5,357,386 A | 10/1994 | Haidari et al. | |
| 5,375,021 A * | 12/1994 | Boeckner | G11B 5/4846 360/264.2 |
| 5,780,771 A | 7/1998 | Beckwith et al. | |
| 5,818,667 A | 10/1998 | Larson | |
| 5,907,452 A * | 5/1999 | Kan | G11B 5/4833 360/99.16 |
| 5,923,501 A * | 7/1999 | Suzuki | G11B 5/4806 360/264.2 |
| 5,953,183 A * | 9/1999 | Butler | G11B 5/4846 360/264.2 |
| 6,480,362 B1 * | 11/2002 | Yoshida | G11B 5/4846 360/245.9 |
| 6,702,592 B1 | 3/2004 | Harden et al. | |
| 6,822,824 B2 * | 11/2004 | MacPherson | G11B 5/484 360/97.16 |
| 6,865,055 B1 | 3/2005 | Ou-Yang et al. | |
| 6,934,126 B1 * | 8/2005 | Berding | G11B 5/4846 360/264.2 |
| 6,970,322 B2 | 11/2005 | Bernett | |
| 7,137,196 B2 | 11/2006 | Gunderson et al. | |
| 7,180,711 B1 | 2/2007 | Chang et al. | |

(Continued)

OTHER PUBLICATIONS

Lynn Bich-Quy Le et al., U.S. Appl. No. 14/843,911, filed Sep. 2, 2015, 31 pages.

*Primary Examiner* — Brian Miller
(74) *Attorney, Agent, or Firm* — Foley & Lardner LLP (57) ABSTRACT

A flexible printed circuit for a storage drive assembly is provided. The flexible printed circuit includes a stiffener layer having a first stiffener region, and a second stiffener region separated from the first stiffener region by a hinge region, a first insulation layer disposed on the stiffener layer, a conductive electrode layer disposed on the first insulation layer; and a second insulation layer disposed on the conductive electrode layer, wherein the hinge region is formed from the first insulation layer, the conductive electrode layer and the second insulation layer.

10 Claims, 9 Drawing Sheets

(56) References Cited

U.S. PATENT DOCUMENTS

| | | | | |
|---|---|---|---|---|
| 7,227,725 B1* | 6/2007 | Chang | G11B 5/4846 | 360/245.9 |
| 7,271,345 B2* | 9/2007 | Freeman | G11B 5/4846 | 174/117 F |
| 7,414,813 B2* | 8/2008 | Huynh | G11B 5/486 | 360/264.2 |
| 7,649,718 B1* | 1/2010 | Edwards | G11B 5/4846 | 360/264.2 |
| 7,871,289 B2* | 1/2011 | Chin | G11B 5/4846 | 174/250 |
| 8,018,687 B1* | 9/2011 | Little | A61M 1/3659 | 360/264.2 |
| 8,111,485 B2* | 2/2012 | Freeman | G11B 5/4806 | 360/264.1 |
| 8,228,639 B2* | 7/2012 | Huang | G11B 5/4846 | 360/264.2 |
| 8,259,417 B1 | 9/2012 | Ho et al. | | |
| 8,270,120 B2* | 9/2012 | Kerner | G11B 5/4846 | 360/245.9 |
| 8,472,145 B2* | 6/2013 | Ho | G11B 5/4846 | 360/264.2 |
| 9,001,470 B1* | 4/2015 | Chan | G11B 5/4846 | 360/264.2 |
| 2005/0194174 A1 | 9/2005 | Hipwell, Jr. et al. | | |
| 2006/0276058 A1* | 12/2006 | Freeman | G11B 5/4846 | 439/67 |
| 2009/0009912 A1* | 1/2009 | Chin | G11B 5/4846 | 360/264.2 |
| 2009/0244782 A1* | 10/2009 | Kagawa | G11B 5/4846 | 360/245.8 |
| 2010/0123976 A1* | 5/2010 | Freeman | G11B 5/4806 | 360/264.2 |

\* cited by examiner

HEAD STACK FLEX ASSEMBLY AND BASE ASSEMBLY FOR STORAGE DRIVE AND METHOD OF ASSEMBLY

BACKGROUND

Figure 1A:
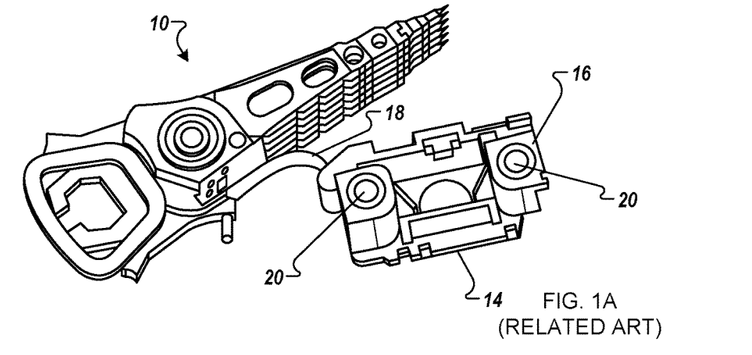
FIG. 1A illustrates a perspective view of a head stack assembly according to a related art configuration.
Figure 1B:
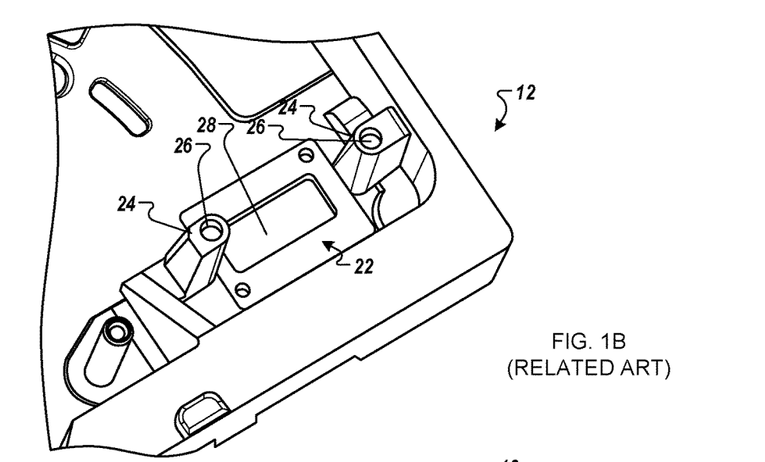
FIGS. 1B and 1C illustrate top and bottom perspective views of a base assembly 12 according to the related art configurations.
Figure 1C:
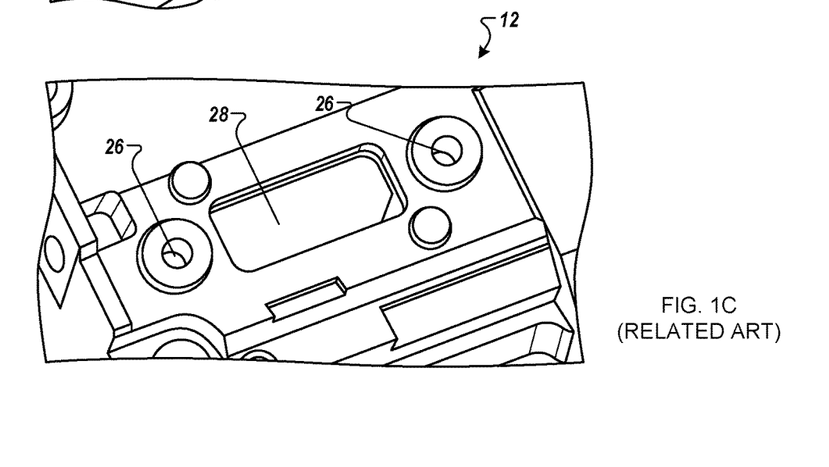

FIG. 1A illustrates a perspective view of a head stack assembly 10 according to a related art configuration. FIGS. 1B and 1C illustrate top and bottom perspective views of a motor base assembly 12 according to the related art configurations. As illustrated in FIG. 1A, an electrical connection between the head stack assembly 10 and a flexible printed circuit assembly 14 may be accomplished using a flex bracket 16 connected to the head stack assembly 10 by a dynamic loop 18. In other words, the dynamic loop 18 connects the head stack assembly 10 to the flex bracket 16, and the flexible printed circuit assembly 14 is attached to the flex bracket 16. The flex bracket 16 also includes one or more mounting screw holes 20 passing there through, which can be used to attach the flex bracket 16 to the motor base assembly 12.

As illustrated in FIGS. 1B and 1C, the motor base assembly 12 includes a bracket receiving area 22 having protrusion structures 24 with screw receiving holes 26 to which the mounting screw holes 20 of the flex bracket 16 can be aligned. The screw receiving holes 26 may pass completely through the motor base assembly 12. The motor base assembly 12 may also include a window 28 passing through the motor base assembly 12. The window 28 may allow electrical connection to the flexible printed circuit assembly 14 when the flex bracket 16 is mounted into the bracket receiving area 22. Sometimes a gasket may also be provided between the flex bracket 16 and the motor base assembly 12 around the window 28. However, the various components of the flex bracket 16, mounting screws, and gasket may increase manufacturing costs. Further, the mounting screws may represent a contamination source, and reduce drive cleanliness.

BRIEF DESCRIPTION OF THE DRAWINGS

A general architecture that implements features of the disclosure will now be described with reference to the drawings. The drawings and the associated descriptions are provided to illustrate embodiments of the disclosure and not to limit the scope of the disclosure. Through the drawings, reference numbers are reused to indicate correspondence between referenced elements.

DETAILED DESCRIPTION

The subject matter described herein is taught by way of example embodiments. Various details may be omitted for the sake of clarity and to avoid obscuring the subject matter described.

Figure 2:
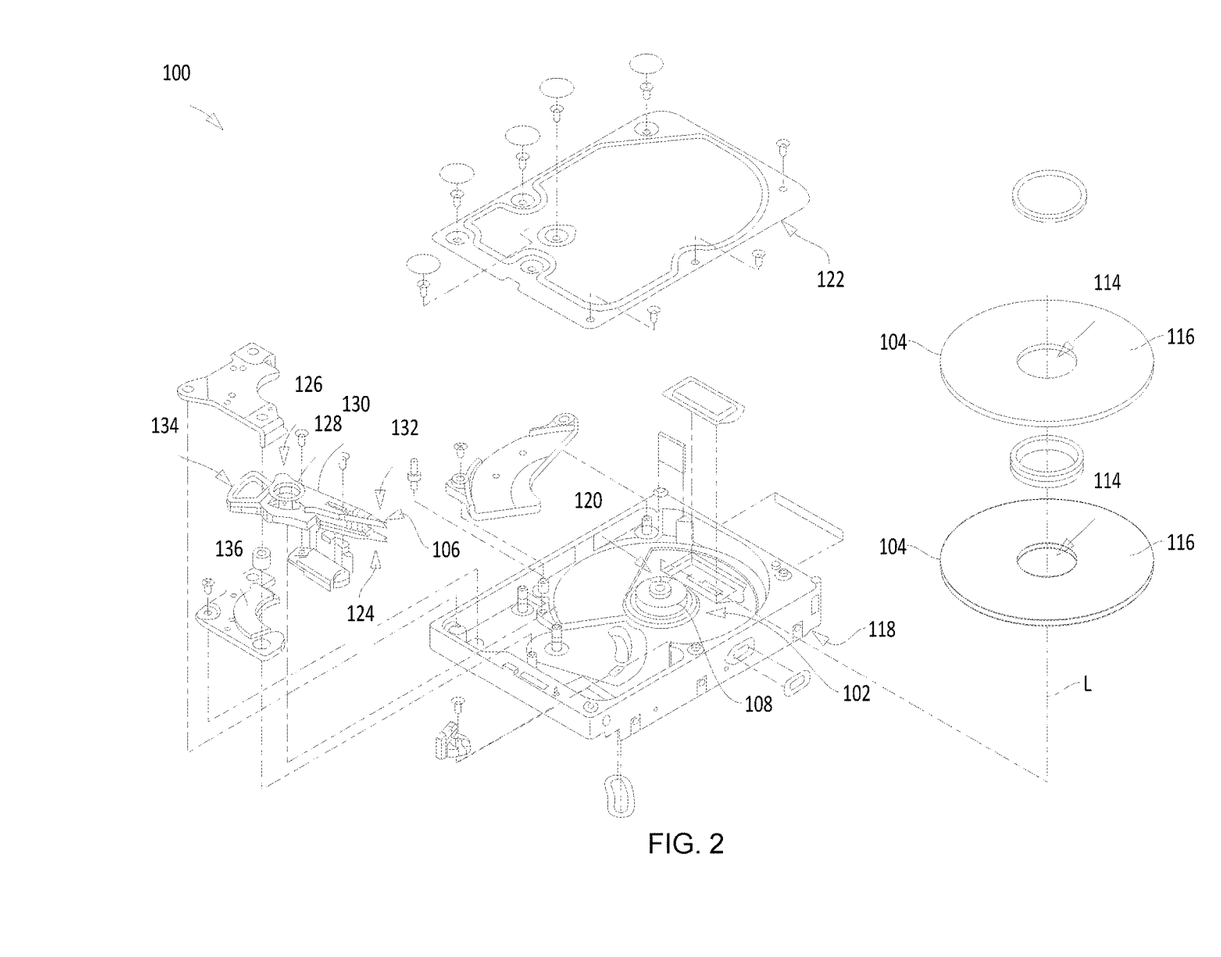
FIG. 2 is an exploded, perspective view generally illustrating a storage device.

FIG. 2 is an exploded, perspective view generally illustrating storage device 100. Referring to FIG. 2, a storage device 100 is illustrated, according to one embodiment. The storage device 100 comprises a hub 102, a media 104 physically contacting and supported by at least one mounting surface (not labeled) of the hub 102, and a head 106 operable to write to and read from the media 104. In one embodiment, the hub 102 comprises a substantially cylindrical portion 108 which defines a longitudinal axis L and a mounting surface substantially normal to the longitudinal axis L, the mounting surface extending radially outward.

As illustrated in FIG. 2, a storage device 100 comprises a magnetic disk drive, and the structures and methods described herein will be described in terms of such a disk drive. However, these structures and methods may also be applied to and/or implemented in other storage devices, including, e.g., solid-state hybrid drives (SSHD), optical and magneto-optical disk drives. Solid-state hybrid drives may additionally include non-volatile memory (e.g., flash).

The media 104 may comprise any of a variety of magnetic or optical disk media having a substantially concentric opening 114 defined there through. Of course, in other embodiments, the storage device 100 may include more or fewer disks. For example, the storage device 100 may include one disk or it may include two or more disks. The media 104 each include a disk surface 116, as well as an opposing disk surface not visible in FIG. 1 above. In one embodiment, the disk surfaces 116 comprise a plurality of generally concentric tracks for storing data.

As illustrated, the hub 102 may be coupled to and support the media 104. The hub 102 may also be rotatably attached to a motor base assembly 118 of the storage device 100, and may form one component of a motor 120 (e.g., a spindle motor). The motor 120 and the hub 102 may be configured to rotate the media 104 about the longitudinal axis L.

Further, a disk clamp may be coupled to the hub 102 to provide a downward clamping force to the media 104. Specifically, the disk clamp may be positioned above the media 104 and attached to an upper surface of the hub 102. The interaction of the disk clamp and the hub 102 provides downward clamping force.

The storage device 100 may further include a cover 122, which, together with the motor base assembly 118, may form a sealed enclosure to house the media 104 and the motor 120. In some embodiments, the cover 122 may be attached to the motor base assembly 118 by a plurality of screws 140.

The storage device 100 may also include a head stack assembly ("HSA") 124 rotatably attached to the motor base assembly 118. The HSA 124 may include an actuator 126 comprising an actuator body 128 and one or more actuator arms 130 extending from the actuator body 128. The actuator body 128 may further be configured to rotate about an actuator pivot axis.

One or two head gimbal assemblies ("HGA") 132 may be attached to a distal end of each actuator arm 130. Each HGA 132 includes a head 106 operable to write to and read from a corresponding media 104. The HSA 124 may further include a coil 134 through which a changing electrical current is passed during operation. The coil 134 interacts with one or more magnets 136 that are attached to the motor base assembly 118 to form a voice coil motor ("VCM") for controllably rotating the HSA 124.

The head 106 may comprise any of a variety of heads for writing to and reading from a media 104. In magnetic recording applications, the head 106 may include an air bearing slider and a magnetic transducer that includes a writer and a read element. The magnetic transducer's writer may be of a longitudinal or perpendicular design, and the read element of the magnetic transducer may be inductive or magneto resistive. In optical and magneto-optical recording applications, the head 106 may include a mirror and an objective lens for focusing laser light on to an adjacent disk surface.

Figure 3:
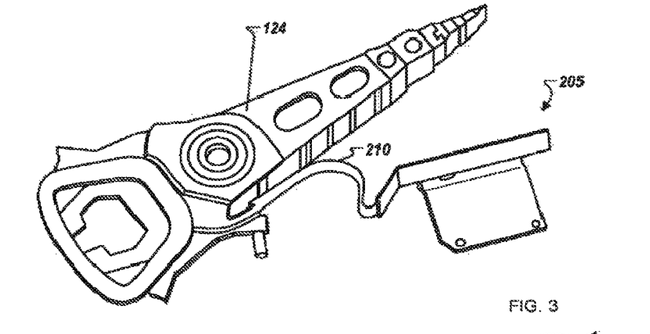
FIG. 3 is a perspective view of a head stack assembly according to an example implementation of the present application.

FIG. 3 is a perspective view of a head stack assembly 124 according to an example implementation of the present application. As illustrated, the head stack assembly 124 is connected to a flexible printed circuit 205 by a dynamic loop 210. The dynamic loop 210 provides electrical connection between the flexible printed circuit 205 and the head stack assembly 124 to allow signal transfer between the flexible printed circuit 205 in the head of the head stack assembly 124. As discussed in greater detail below with respect to FIGS. 6A and 6B, the flexible printed circuit 205 may have a laminated structure.

Figure 4:
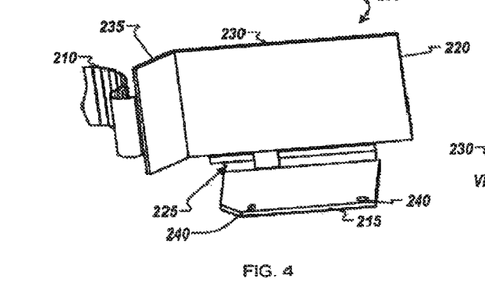
FIG. 4 is a first perspective view of a flexible printed circuit for a head stack assembly according to an example implementation of the present application.
Figure 5:
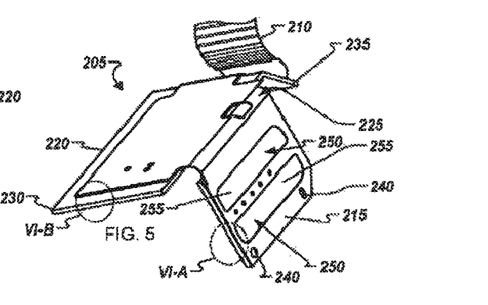
FIG. 5 is a second perspective view of the flexible printed circuit for a head stack assembly according to an example implementation of the present application.

FIG. 4 is a first perspective view of a flexible printed circuit 205 for the head stack assembly 124 according to an example implementation of the present application showing top surfaces of the flexible printed circuit 205. FIG. 5 is a second perspective view of the flexible printed circuit 205 for a head stack assembly 124 according to an example implementation of the present application showing bottom surfaces of the flexible printed circuit 205.

As illustrated, the flexible printed circuit 205 includes a first stiffener region 215 and a second stiffener region 220 connected by a hinge region 225. The hinge region 225 may have greater flexibility than the first stiffener region 215, and the second stiffener region 220 allows the hinge region 225 to bend such that the first stiffener region 215 and the second stiffener region 220 may move relative to each other.

The second stiffener region 220 may include a first plate section 230 which extends substantially parallel to the first stiffener region 215. The second stiffener region 220 may also include a second plate section 235 that is angled with respect to the first plate section 230. The second plate section 235 may connect the first plate section 230 with the dynamic loop region 210.

The bottom surface of the first stiffener region 215 may include one or more contact pad regions 250. In some example limitations, the contact pad regions 250 may be formed by an area of non-insulation that allows access to an internal electrode 255 located within the flexible printed circuit 205. Further, in some example implementations, the first stiffener region 215 may also include alignment features 240. For example, one or more holes, bumps, nodules, or other alignment features that may be apparent to a person of ordinary skill in the art may be formed on the first stiffener region 215. As discussed in greater detail below, the alignment features 240 may be used to align the flexible printed circuit 205 with a motor base assembly.

Figure 6A:
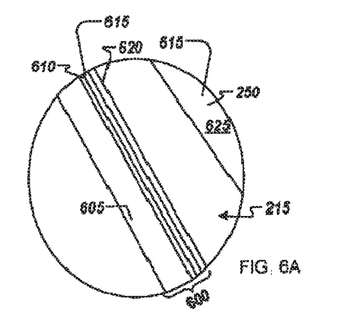
FIGS. 6A and 6B are enlarged views of the flexible printed circuit according to an example implementation of the present application.
Figure 6B:
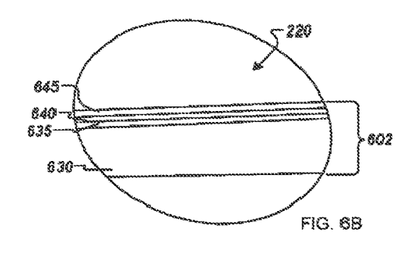

FIGS. 6A and 6B are enlarged views of the flexible printed circuit 205 according to an example implementation of the present application. Specifically, FIG. 6A illustrates an enlarged view of the first stiffener region 215 of the flexible printed circuit illustrating a laminate structure 600. As illustrated, the laminate structure 600 of the first stiffener region 215 includes a stiffener layer 605. In some example implementations, the stiffener layer 605 may be formed from a rigid material that can provide support for the other layers in the laminate structure 600. For example, the stiffener layer 605 may be formed from aluminum, stainless steel, or any other rigid material that may be apparent to a person of ordinary skill in the art.

The laminate structure 600 of the first stiffener region 215 may also include a first insulation layer 610 formed on the stiffener layer 605, an electrically conductive layer 615 formed on the first insulation layer 610, and a second insulation layer 620 formed on the electrically conductive layer 615. The electrically conductive layer 615 may be formed from any electrically conductive material including but not limited to gold, zinc, silver, or any other material that may be apparent to a person of ordinary skill in the art.

Further, the first insulation layer 610 and the second insulation layer 620 may be formed from any electrically isolative material that may be apparent to a person of ordinary skill in the art. For example, the first insulation layer 610 and the second insulation layer 620 may be formed from silicon nitride, silicon oxide, or any other material that may be apparent to a person of ordinary skill in the art. Additionally, in some example of limitations, the second insulation layer 620 may include an area of non-insulation 625 that provides access to the electrically conductive layer 615 under the second insulation layer 622 to form the contact pad region 250.

FIG. 6B illustrates an enlarged view of the second stiffener region 220 of the flexible printed circuit illustrating a laminate structure 602. As illustrated, the laminate structure 602 of the second stiffener region 220 includes a stiffener layer 630. In some example implementations, the stiffener layer 630 may be formed from a rigid material that can provide support for the other layers in the laminate structure 600. For example, the stiffener layer 630 may be formed from aluminum, stainless steel, or any other rigid material that may be apparent to a person of ordinary skill in the art.

The laminate structure 602 of the second stiffener region 220 may also include a first insulation layer 635 formed on the stiffener layer 630, an electrically conductive layer 640 formed on the first insulation layer 635, and a second insulation layer 645 formed on the electrically conductive layer 640. The electrically conductive layer 640 may be formed from any electrically conductive material including but not limited to gold, zinc, silver, or any other material that may be apparent to a person of ordinary skill in the art.

Further, the first insulation layer 635 and the second insulation layer 645 may be formed from any electrically isolative material that may be apparent to a person of ordinary skill in the art. For example, the first insulation layer 635 and the second insulation layer 645 may be formed from silicon nitride, silicon oxide, or any other material that may be apparent to a person of ordinary skill in the art.

Figure 7:
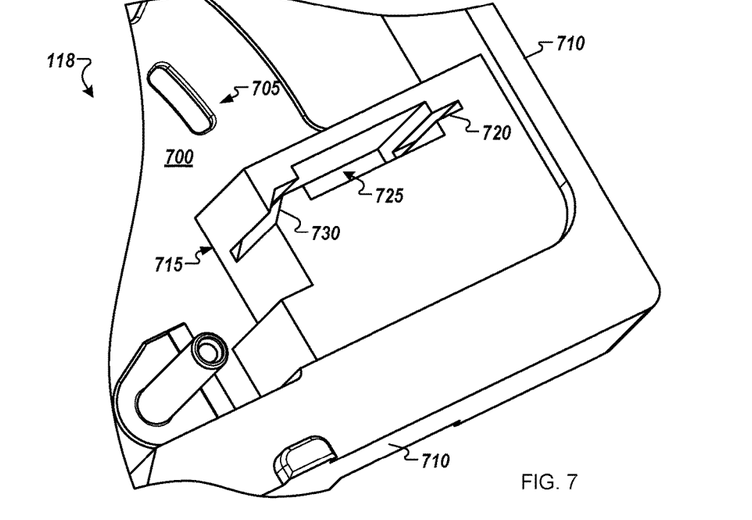
FIG. 7 is a first perspective view of a motor base assembly according to an example implementation of the present application.
Figure 8:
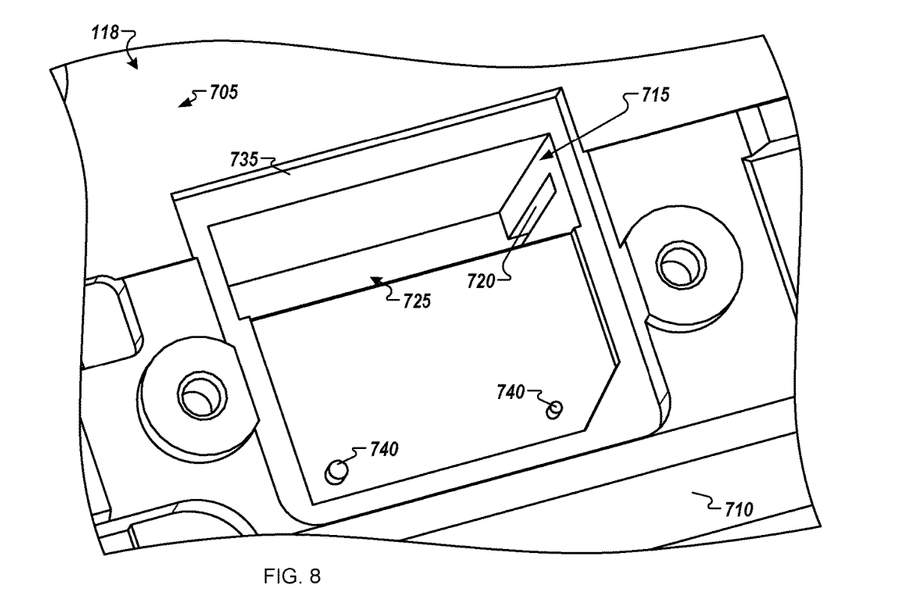
FIG. 8 is a second perspective view of the motor base assembly according to an example implementation of the present application.

FIG. 7 is a first perspective view of a motor base assembly 118 according to an example implementation of the present application illustrating an upper surface of the motor base assembly 118. Further, FIG. 8 is a second perspective view of the motor base assembly 118 according to an example implementation of the present application illustrating a lower upper surface of the motor base assembly 118. As illustrated, the motor base assembly 118 includes a basewall 705 (e.g., a floor) and a plurality of sidewalls 710 extending upward from the basewall 705 to define an interior 700 of the motor base assembly 118. Further, within the interior 700 of the motor base assembly 118, a stiffener support portion 715 is also formed.

The stiffener support portion 715 may include a stiffener guide slot 720 and a hole 725 adjacent the stiffener guide slot 720. In some example implementations, the hole 725 may extend through the support portion 715 and the basewall 705 of the motor base assembly 118. Further, in some example implementations the stiffener support portion 715 may also include a secondary plate slot 730. Additionally, in some example implementations, the exterior of the base wall 705 may also include alignment features 740 and a land region 735. The alignment features 740 may include one or more holes, bumps, nodules, or other alignment features that may be apparent to a person of ordinary skill in the art. As discussed in greater detail below, the alignment features 740 of the motor base assembly 118 may be used to align the flexible printed circuit 205.

Figure 9:
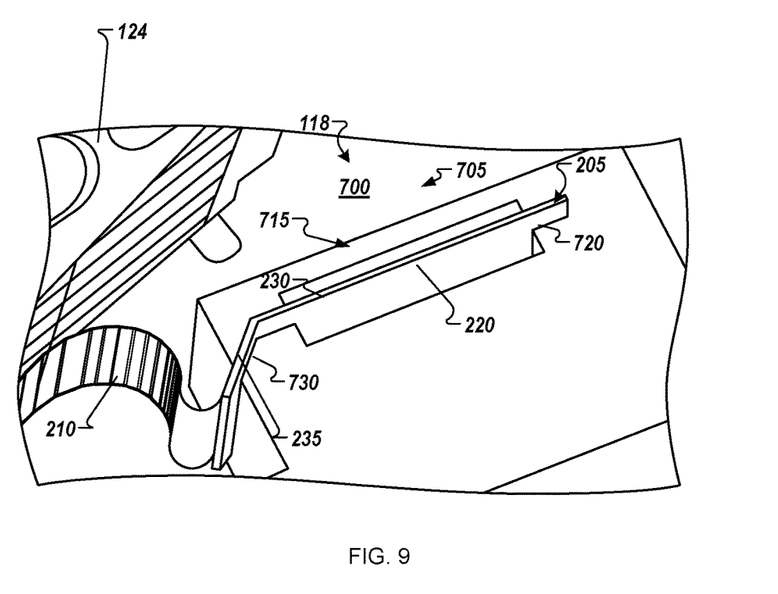
FIG. 9 is a first perspective view of the motor base assembly with a flexible printed circuit installed according to an example implementation of the present application.

FIG. 9 is a first perspective view of the motor base assembly 118 with a flexible printed circuit 205 installed according to an example of implementation of the present application illustrating an upper surface thereof. As illustrated, the second stiffener region 220 of the flexible printed circuit 205 has been installed in the support portion 715 of the basewall 705. Specifically, the first plate section 230 is installed in the stiffener guide slot 720 and the second plate section 235 is installed in the secondary plate slot 730. The dynamic loop 210 runs from an end of the second plate section 235 that extends out of the secondary plate slot 730 to connect the flexible printed circuit 205 to the head stack assembly 124 located within the interior 700 of the motor base assembly 118.

Figure 10:
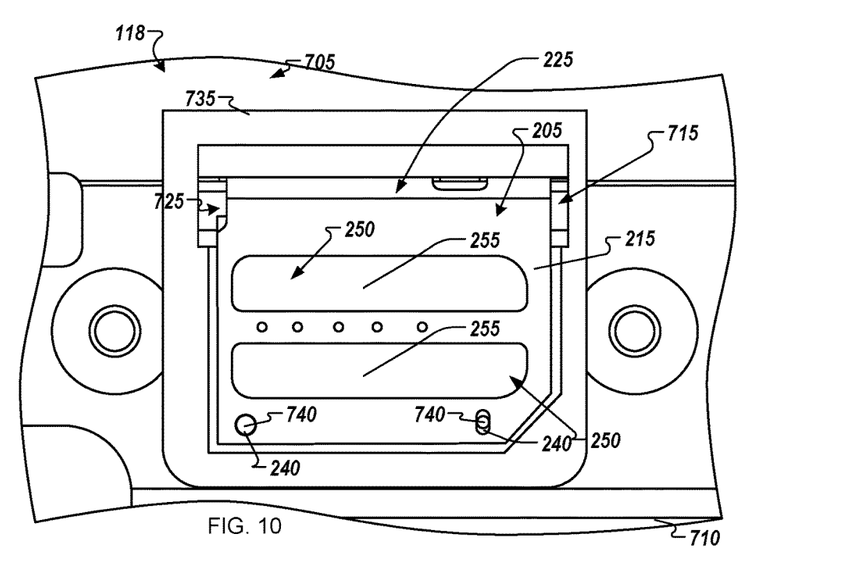
FIG. 10 is a second perspective view of the motor base assembly with a flexible printed circuit installed according to an example implementation of the present application.

FIG. 10 is a second perspective view of the motor base assembly 118 with a flexible printed circuit 205 installed according to an example implementation of the present application illustrating a lower surface thereof. As illustrated, the first stiffener region 215 has been inserted through the hole 725 through the basewall 705 and the flexible printed circuit 205 has been bent along the hinge region 225 to position the first stiffener region 215 against the basewall 705 of the motor base assembly 118. The first stiffener region 215 has been oriented such that contact regions 250 are directed away from the basewall 705 of the motor base assembly 118. Such an orientation may allow access to the internal electrode 255 of the contact regions 250 from outside the motor base assembly 118. Further, in some example implementations, the alignment features 240 of the first stiffener region 215 may be aligned with the alignment features 740 of the motor base assembly 118.

Figure 11:
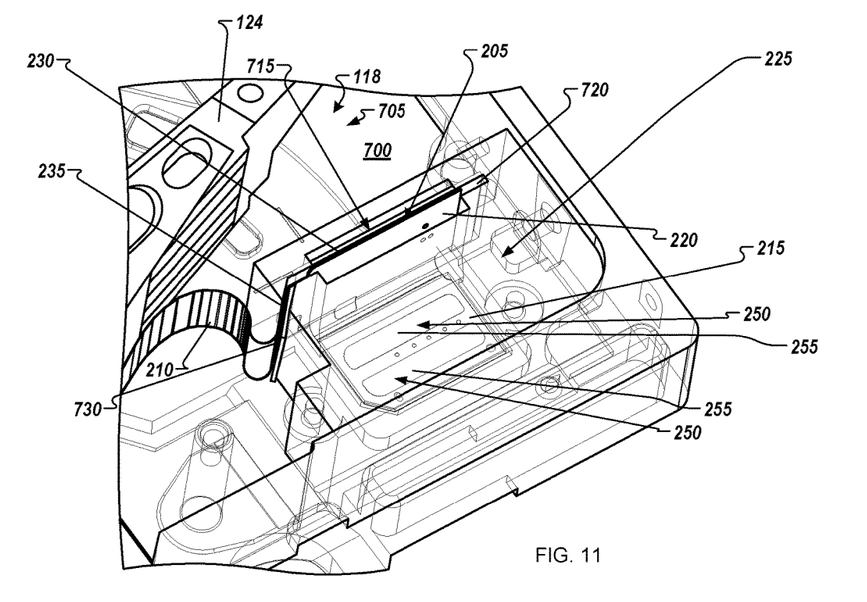
FIG. 11 is a first transparent perspective view of the motor base assembly with a flexible printed circuit installed according to an example implementation of the present application.
Figure 12:
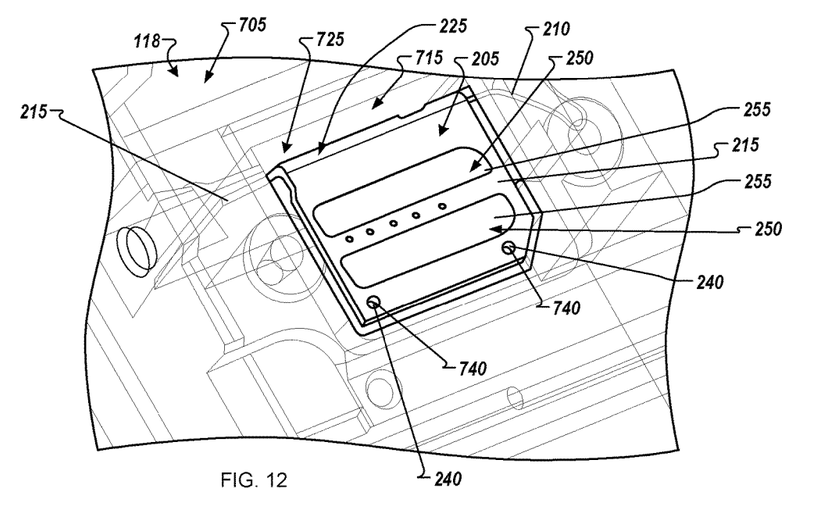
FIG. 12 is a second transparent perspective view of the motor base assembly with a flexible printed circuit installed according to an example implementation of the present application.

FIG. 11 is a first transparent perspective view of the motor base assembly 118 with a flexible printed circuit 205 installed according to an example implementation of the present application. Further, FIG. 12 is a second transparent perspective view of the motor base assembly 118 with a flexible printed circuit 205 installed according to an example implementation of the present application. Again, the second stiffener region 220 of the flexible printed circuit 205 is illustrated installed in the support portion 715 of the base wall 705. Specifically, the first plate section 230 is installed in the stiffener guide slot 720 and the second plate section 235 is installed in the secondary plate slot 730. The dynamic loop 210 runs from an end of the second plate section 235 that extends out of the secondary plate slot 730 to connect the flexible printed circuit 205 to the head stack assembly 124 located within the interior 700 of the motor base assembly 118.

Further, the first stiffener region 215 has been inserted through the hole 725 through the basewall 705 and the flexible printed circuit 205 has been bent along the hinge region 225 to position the first stiffener region 215 against the basewall 705 of the motor base assembly 118. The first stiffener region 215 has been oriented such that contact regions 250 are directed away from the basewall 705 of the motor base assembly 118. Such an orientation may allow access to the internal electrode 255 of the contact regions 250 from outside the motor base assembly 118. Further, in some example implementations, the alignment features 240 of the first stiffener region 215 may be aligned with the alignment features 740 of the motor base assembly 118.

Figure 13:
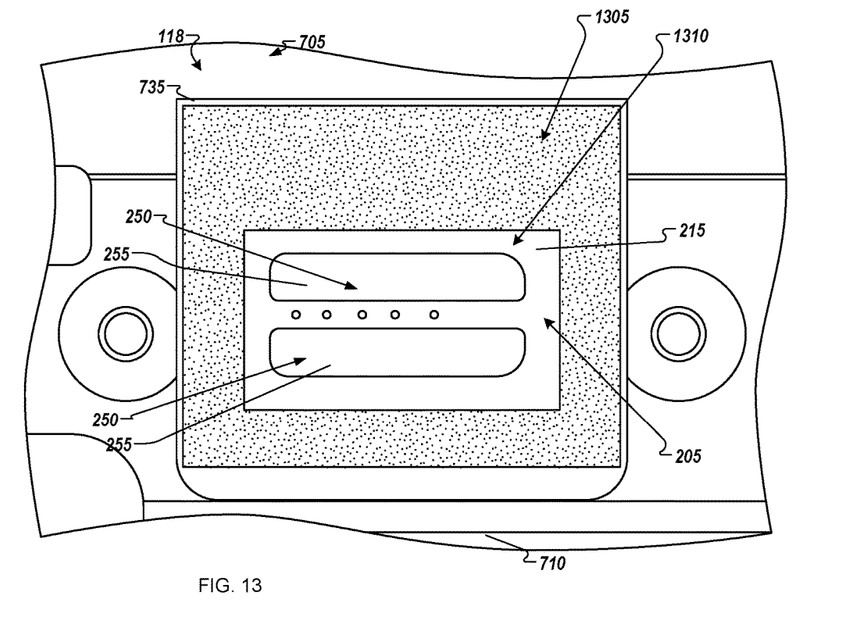
FIG. 13 is bottom view of the motor base assembly with an adhesive seal installed over a portion of the flexible printed circuit according to an example implementation of the present application.

FIG. 13 is bottom view of the motor base assembly 118 with an adhesive seal 1305 installed over a portion of the flexible printed circuit 205. As illustrated the seal 1305 may be installed over the first stiffener region 215 of the flexible printed circuit 205 and is attached to the land region 735 of the motor base assembly 118. In some example implementations, the seal 1305 may hermetically seal the motor base assembly 118. The seal 1305 may also attach flexible printed circuit 205 and may also form a hermetic seal therewith. The seal 1305 may be a self-adhesive seal, or may be attached using an applied adhesive or other sealing compound (e.g., glue, epoxy, solder, welding compound or any other sealing compound relevant to a person of ordinary skill in the art) between the seal 1305 and the land region 735 of the motor base assembly 118.

In some example implementations, the seal 1305 may include a window 1310 that provides access to portions of the first stiffener region 215 of the flexible printed circuit 205. As illustrated, the internal electrodes 255 of the contact pad regions 250 are accessible through the window 1310 of the seal 1305. Such a configuration may allow access to the internal electrode 255 of the contact regions 250 from outside the motor base assembly 118.

Figure 14:
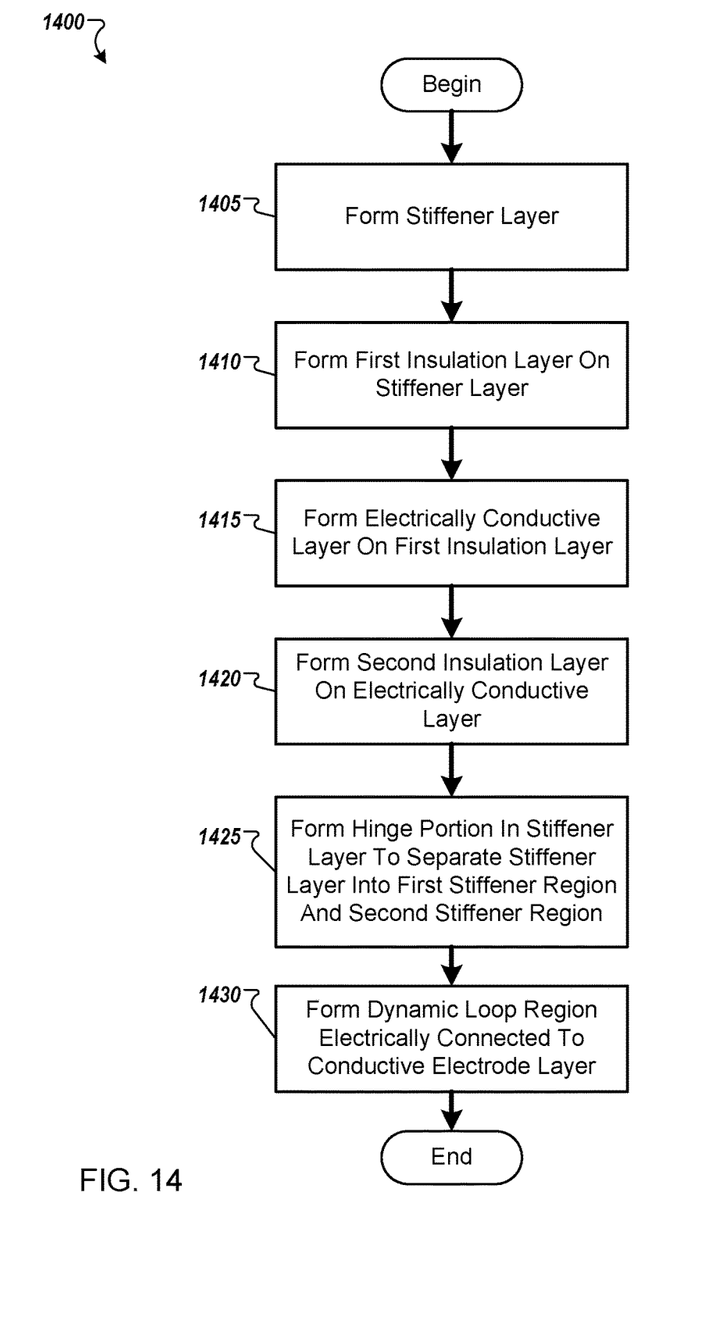
FIG. 14 is a flowchart for a process of manufacturing a flexible printed circuit according to an example implementation of the present application.

FIG. 14 is a flowchart for a process 1400 of manufacturing a flexible printed circuit according to an example implementation of the present application. For simplicity, some steps may be omitted, interleaved, and/or combined. The process 1400 may be used to manufacture an example implementation of a flexible printed circuit 205 discussed above. Further, the process 1400 may also be used to fabricate multiple flexible printed circuits 205 at substantially the same time. The process 1400 may also be used to fabricate other flexible printed circuits, as may be apparent to a person of ordinary skill in the art. The method 500 is also described in the context of particular layers. A particular layer may include multiple materials and/or multiple sub-layers.

In 1405, a stiffener layer 605, 630 is formed. The stiffener layer 605, 630 may be formed from metal (e.g., aluminum, nickel, iron, or other metallic material), ceramic, or any other stiffening material that may be apparent to a person of ordinary skill in the art. Further, the forming process of the stiffener layer 605, 630 is not particularly limited and may include any process that may be apparent to a person of ordinary skill in the art including deposition, sputtering or any other known process that may be apparent.

Further, in 1410, a first insulation layer 610, 635 is formed on the stiffener layer 605, 630. The first insulation layer 610, 635 may be formed from a non-conductive material including a ceramic material, polymer material, or other non-metallic material that may be apparent to a person of ordinary skill in the art. For example, the non-conductive material may be silicon nitride, silicon oxide, or any other material that may be apparent to a person of ordinary skill in the art. Further, the forming process of the first insulation layer 610, 635 is not particularly limited and may include any process that may be apparent to a person of ordinary skill in the art including deposition, sputtering or any other known process that may be apparent.

In 1415, an electrically conductive layer 615, 640 is formed on the first insulation layer 610, 635. The electrically conductive layer 615, 640 may be formed from a conductive material including a metallic material, or any other material that may be apparent to a person of ordinary skill in the art. For example, the conductive material may be gold, aluminum, silver, zinc, or any other material that may be apparent to a person of ordinary skill in the art. Further, the forming process of the electrically conductive layer 615, 640 is not particularly limited and may include any process that may be apparent to a person of ordinary skill in the art including deposition, sputtering or any other known process that may be apparent.

Further, in 1420, a second insulation layer 620, 645 is formed on the conductive layer 615, 640. The second insulation layer 620, 645 may be formed from a non-conductive material including a ceramic material, polymer material, or other non-metallic material that may be apparent to a person of ordinary skill in the art. For example, the non-conductive material may be silicon nitride, silicon oxide, or any other material that may be apparent to a person of ordinary skill in the art. Further, the forming process of the second insulation layer 620, 645 is not particularly limited and may include any process that may be apparent to a person of ordinary skill in the art including deposition, sputtering or any other known process that may be apparent.

Further, in some example implementations, the forming of the second insulation layer 620, 645 may also include an etching process to expose a portion of the electrically conductive layer 615, 640 beneath the second insulation layer 620, 645 to form a contact pad region 250. The etching process is not particularly limited and may include a wet etch, a dry etch, or any other material removing process that may be apparent to a person of ordinary skill in the art.

After the second insulation layer 620, 645 is formed, a hinge region 225 is formed to separate the stiffener layer 605, 630 into first and second stiffener regions 215, 220 in 1425. The forming of the hinge region 225 may include an etching process or any other material removal process to remove the stiffener region 605, 630 from a region of the flexible printed circuit 205 while leaving the remaining layers (e.g., the first and second insulation layers 610, 620, 635, 645 and the electrically conductive layer 615, 640). The process used to form the hinge region 225 is not particularly limited and may include a wet etch, a dry etch, or any other material removing process that may be apparent to a person of ordinary skill in the art.

Further, a dynamic loop region 210 may be formed at one end of the second stiffener regions 215, 220 in 1430. The forming of the dynamic loop region 210 may also include an etching process or any other material removal process to remove the stiffener region 605, 630 from a region at one end of the second stiffener region 215, 220 of the flexible printed circuit 205 while leaving the remaining layers (e.g., the first and second insulation layers 610, 620, 635, 645 and the electrically conductive layer 615, 640). The process used to form dynamic loop region 210 is not particularly limited and may include a wet etch, a dry etch, or any other material removing process that may be apparent to a person of ordinary skill in the art. After the dynamic loop region is formed, the process 1400 may end.

Figure 15:
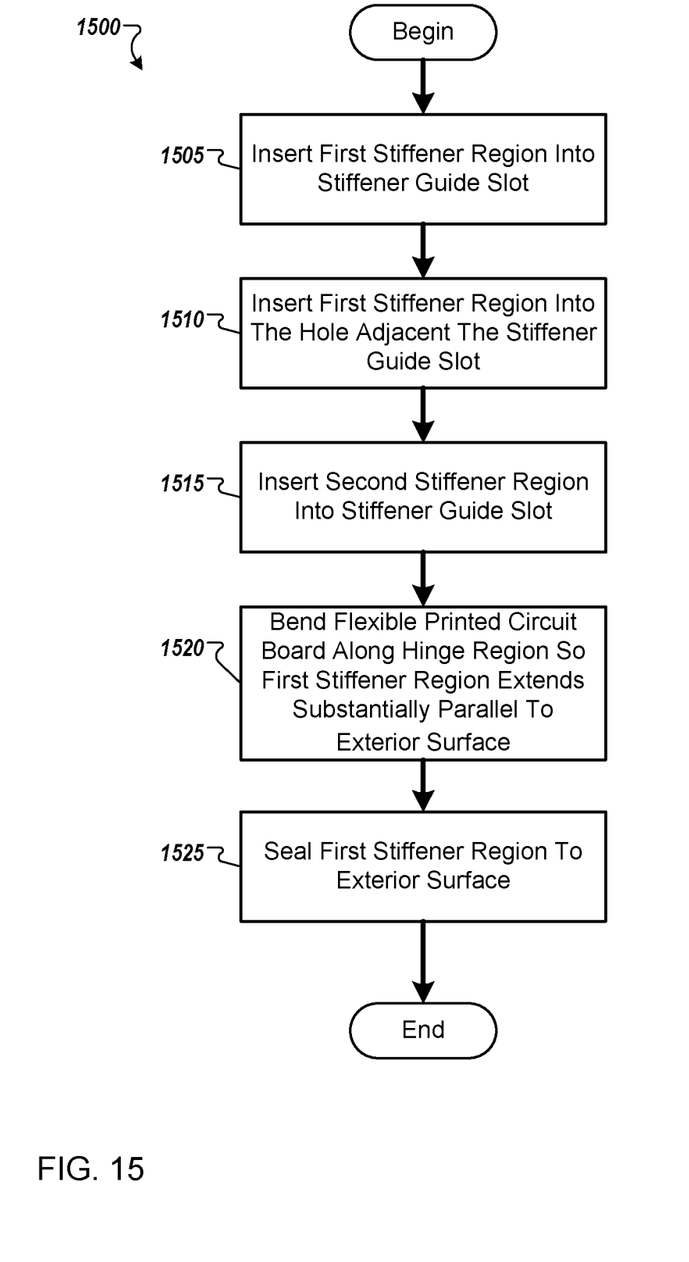
FIG. 15 is a flowchart for a process of assembling a storage drive assembly according to an example implementation of the present application.

FIG. 15 is a flowchart for a process 1500 of assembling a storage drive assembly according to an example implementation of the present application. The process 1500 may be used to form a storage drive assembly 100 and components thereof illustrated in FIGS. 2-13 discussed above. In the process 1500, a flexible printed circuit (e.g., flexible printed circuit 205 discussed above) may be installed in a motor base assembly (e.g., motor base assembly 118 discussed above.

At 1505, a first stiffener region 215 of the flexible printed circuit 205 may be inserted into a stiffener guide slot 720 of a stiffener support portion 715 of the motor base assembly 118. In some example implementations, the insertion of the first stiffener region 215 into the stiffener guide slot 720 may be manually performed by a human. In other example implementations, the insertion of the first stiffener region 215 may be assisted or completely performed by a computer controlled placement device (e.g., a user controlled or fully automated assembly robot or other device that may be apparent to a person of ordinary skill in the art). Further, the insertion of the first stiffener region 215 may also be assisted by a computer vision system in some example implementations.

Further at 1510, the first stiffener region 215 of the flexible printed circuit 205 may be inserted through a hole 725 through the basewall 705 of the motor base assembly 118 adjacent the stiffener guide slot 720. In some example implementations, the insertion of the first stiffener region 215 through the hole 725 may be manually performed by a human. In other example implementations, the insertion of the first stiffener region 215 may be assisted or completely performed by a computer controlled placement device (e.g., a user controlled or fully automated assembly robot or other device that may be apparent to a person of ordinary skill in the art.) Further, the insertion of the first stiffener region 215 may also be assisted by a computer vision system in some example implementations.

Additionally at 1515, a second stiffener region 220 of the flexible printed circuit 205 may be inserted into the stiffener guide slot 720 of the stiffener support portion 715 of the motor base assembly 118. In some example implementations, the insertion of the second stiffener region 220 into the stiffener guide slot 720 may be manually performed by a human. In other example implementations, the insertion of the second stiffener region 220 may be assisted or completely performed by a computer controlled placement device (e.g., a user controlled or fully automated assembly robot or other device that may be apparent to a person of ordinary skill in the art). Further, the insertion of the second stiffener region 220 may also be assisted by a computer vision system in some example implementations.

In some example implementations, the insertion of the second stiffener region 220 into the stiffener guide slot 720 may include inserting a first plate section 230 of the second stiffener region 220 into the stiffener guide slot 720 and inserting a second plate section 235 into a secondary plate slot 730 adjacent the stiffener guide slot 720. Again, in some example implementations, the insertion of the first plate section 230 of the second stiffener region 220 into the stiffener guide slot 720 and the insertion of the a second plate section 235 into the secondary plate slot 730 may be manually performed by a human. In other example implementations, the insertion of the first plate section 230 of the second stiffener region 220 into the stiffener guide slot 720 and the insertion of the a second plate section 235 into the secondary plate slot 730 may be assisted or completely performed by a computer controlled placement device (e.g., a user controlled or fully automated assembly robot or other device that may be apparent to a person of ordinary skill in the art.) Further, the insertion of the first plate section 230 of the second stiffener region 220 into the stiffener guide slot 720 and the insertion of the a second plate section 235 into the secondary plate slot 730 may also be assisted by a computer vision system in some example implementations.

After the insertion of the second stiffener region 220, the flexible printed circuit 205 may be bent along a hinge region 225 such that the first stiffener region 215 extends substantially parallel to a basewall 705 of the motor base assembly 118 at 1520. In some example implementations, the bending of the flexible printed circuit 205 along the hinge region 225 may be manually performed by a human. In other example implementations, the bending of the flexible printed circuit 205 along the hinge region 225 may be assisted or completely performed by a computer controlled manipulation device (e.g., a user controlled or fully automated assembly robot or other device that may be apparent to a person of ordinary skill in the art). Further, the bending of the flexible printed circuit 205 along the hinge region 225 may also be assisted by a computer vision system in some example implementations.

In some example implementations, the bending of the flexible printed circuit 205 along the hinge region 225 may include aligning alignment features 240 formed on the first stiffener region 215 with alignment features 740 formed on the motor base assembly 118. The aligning the alignment features 240 formed on the first stiffener region 215 with alignment features 740 formed on the motor base assembly 118 may be manually performed by a human eye in some example implementations. In some implementations, the aligning the alignment features 240 formed on the first stiffener region 215 with alignment features 740 formed on the motor base assembly 118 may be assisted or completely performed by a computer vision system.

Further at 1525, the first stiffener region 215 may be sealed to the motor base assembly 118. The sealing of the first stiffener region 215 may form a hermetic seal in some example implementations. In some example implementations, the sealing of the first stiffener region 215 to the motor base assembly 118 may performed by applying a liquid, semi-liquid or gelatinous sealing agent (e.g., an adhesive, a liquid gasket, or any other sealing agent that may be apparent to a person of ordinary skill in the art). In other example implementations, the sealing of the first stiffener region 215 to the motor base assembly 118 may be performed by applying a solid seal (e.g., a self-adhesive seal or gasket, a seal or gasket with separate adhesive, or any other seal device that may be apparent to a person of ordinary skill in the art) over the first stiffener region 215.

In some example implementations, the sealing of the first stiffener region 215 may be manually performed by a human. In other example implementations, the sealing of the first stiffener region 215 may be assisted or completely performed by a computer controlled manipulation device (e.g., a user controlled or fully automated assembly robot or other device that may be apparent to a person of ordinary skill in the art). Further, the sealing of the first stiffener region 215 may also be assisted by a computer vision system in some example implementations. Once the first stiffener region 215 is sealed to the motor base assembly 118, the process 1500 may end.

The foregoing detailed description has set forth various implementations of the devices and/or processes via the use of block diagrams, schematics, and examples. Insofar as such block diagrams, schematics, and examples contain one or more functions and/or operations, each function and/or operation within such block diagrams, flowcharts, or examples can be implemented, individually and/or collectively, by a wide range of hardware, software, firmware, or virtually any combination thereof.

While certain implementations have been described, these implementations have been presented by way of example only, and are not intended to limit the scope of the protection. Indeed, the novel methods and apparatuses described herein may be embodied in a variety of other forms. Furthermore, various omissions, substitutions and changes in the form of the methods and systems described herein may be made without departing from the spirit of the protection. The accompanying claims and their equivalents are intended to cover such forms or modifications as would fall within the scope and spirit of the protection.

I claim:

1. A method of manufacturing a flexible printed circuit for a storage drive assembly, the method comprising:
    forming a stiffener layer;
    forming a first insulation layer on the stiffener layer;
    forming a conductive electrode layer on the first insulation layer;
    forming a second insulation layer on the conductive electrode layer,
        wherein the second insulation layer is continuously separated from the first insulation layer by the conductive electrode layer; and
    forming a hinge portion in the stiffener layer to separate the stiffener layer into a first stiffener region and a second stiffener region spaced a distance apart from the first stiffener region.

2. The method of claim 1, wherein the forming the second insulation layer comprises forming regions of non-insulation over portions of the conductive electrode layer to form one or more conductive pad regions, wherein the first stiffener region is formed near the one or more conductive pad regions to reinforce the one or more conductive pad regions.

3. The method of claim 1, further comprising forming a dynamic loop region electrically connected to the conductive electrode layer, wherein the dynamic loop region is formed to extend from an end of the second stiffener region disposed away from the hinge portion and the first stiffener region.

4. The method of claim 3, wherein the forming the second stiffener region comprises forming a first plate section and a second plate section angled with respect to the first plate section, the second plate section extending toward the dynamic loop region.

5. The method of claim 1, wherein the forming the first stiffener region comprises forming an alignment feature configured to engage an alignment feature on a motor base assembly.

6. A flexible printed circuit for a storage drive assembly, the flexible printed circuit comprising:
   a stiffener layer comprising:
      a first stiffener region, and
      a second stiffener region separated from the first stiffener region by a hinge region;
   a first insulation layer disposed on the stiffener layer;
   a conductive electrode layer disposed on the first insulation layer; and
   a second insulation layer disposed on the conductive electrode layer, wherein the hinge region is formed from the first insulation layer, the conductive electrode layer and the second insulation layer,
      wherein the second insulation layer is continuously separated from the first insulation layer by the conductive electrode layer.

7. The flexible printed circuit of claim 6, wherein the conductive electrode layer comprises one or more conductive pad regions exposed by regions of non-insulation formed in the second insulation layer, wherein the first stiffener region is formed near the one or more conductive pad regions and is configured to reinforce the one or more conductive pad regions.

8. The flexible printed circuit of claim 7, further comprising a dynamic loop region electrically connected to the conductive electrode layer, wherein the dynamic loop region extends from an end of the second stiffener region disposed away from the hinge region and the first stiffener region.

9. The flexible printed circuit of claim 8, wherein the second stiffener region further comprises an angled region extending toward the dynamic loop region.

10. The flexible printed circuit of claim 6, wherein the first stiffener region comprises an alignment feature configured to engage an alignment feature on a motor base assembly.

* * * * *